United States Patent [19]

Lemelson

[11] Patent Number: 4,666,678
[45] Date of Patent: May 19, 1987

[54] RADIATION BEAM APPARATUS AND METHOD

[76] Inventor: Jerome H. Lemelson, 85 Reactor St., Metuchen, N.J. 08840

[21] Appl. No.: 737,446

[22] Filed: Oct. 29, 1976

Related U.S. Application Data

[63] Continuation-in-part of Ser. No. 12,082, Feb. 17, 1970, abandoned, and a continuation of Ser. No. 165,445, Jul. 26, 1971, abandoned, which is a continuation-in-part of Ser. No. 710,517, Mar. 5, 1968, abandoned, which is a continuation-in-part of Ser. No. 501,395, Oct. 22, 1965, Pat. No. 3,371,404, which is a continuation of Ser. No. 668,561, Jun. 27, 1957, abandoned.

[51] Int. Cl.⁴ .............................................. B01J 19/08
[52] U.S. Cl. .................................. 422/186; 204/57.61
[58] Field of Search ................ 60/203; 204/DIG. 11, 204/157.1 R; 332/7.51; 250/527; 422/186

[56] References Cited

U.S. PATENT DOCUMENTS

| | | | |
|---|---|---|---|
| 1,700,675 | 1/1929 | Goddard | 60/DIG. 8 |
| 2,137,598 | 11/1938 | Vos | 102/70.2 D |
| 3,427,118 | 2/1969 | Andress et al. | 60/39.82 R |
| 3,443,087 | 5/1969 | Robieux et al. | 250/290 |

OTHER PUBLICATIONS

Lengyel, B., *Lasers*, John Wiley & Sons, Inc., 1962, pp. 100–105.

*Primary Examiner*—John F. Terapane
*Assistant Examiner*—Howard J. Locker

[57] ABSTRACT

An apparatus and method are provided for operating on material disposed in a container. In one form, an intense radiation beam is generated exterior of the container and is directed through an opening or window in the wall of the container along a predetermined path so as to predeterminately intersect matter disposed within the container and react on said matter. The beam may be generated by a laser or electron gun and may operate to perform one or more of such operations as creating chemical reactions, heating, volatizing, eroding, welding or exploding matter within the chamber which it intersects. Means are also provided for controlling the means generating the beam and means for admitting and removing matter relative the chamber.

25 Claims, 12 Drawing Figures

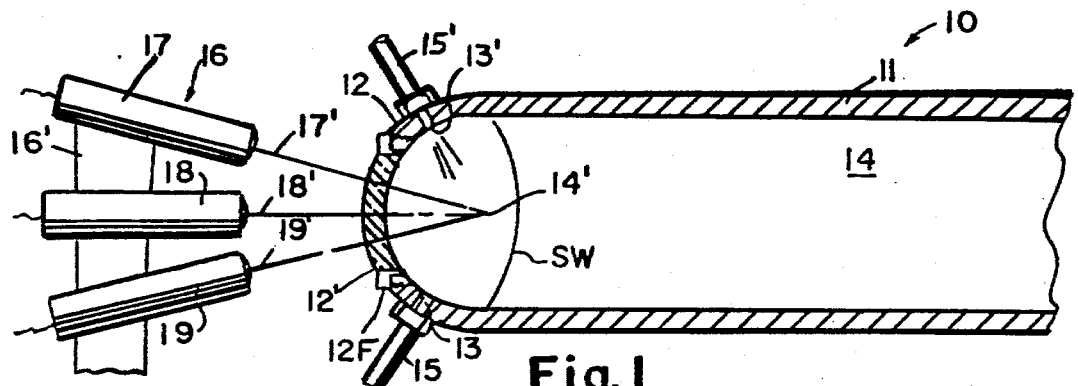
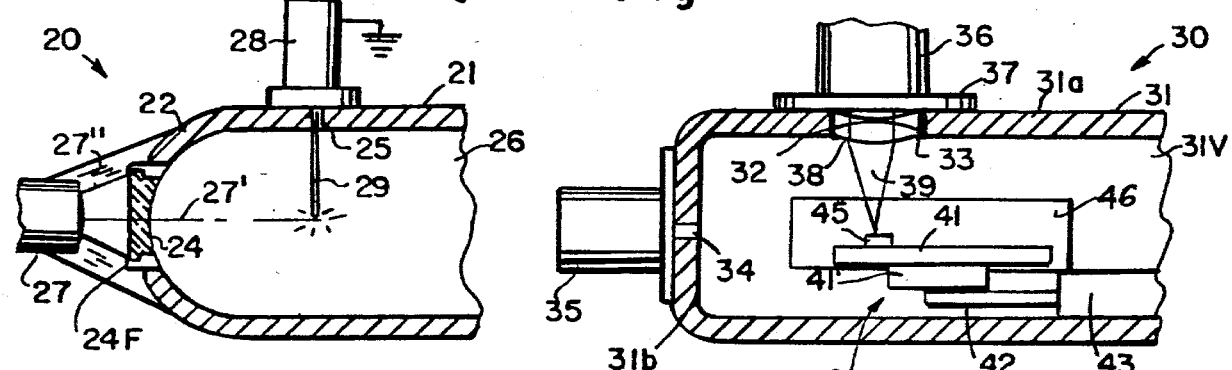
Fig. 1
Fig. 2
Fig. 3
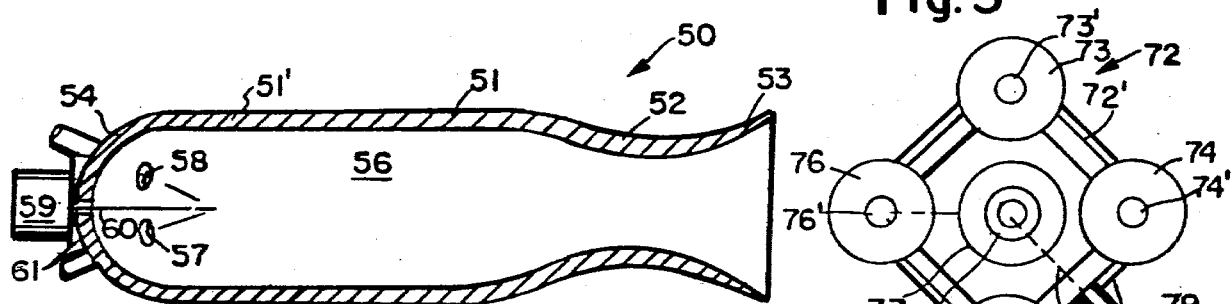
Fig. 4
Fig. 5
Fig. 6
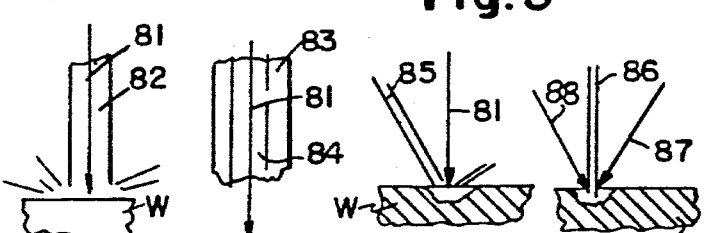
Fig. 7   Fig. 8   Fig. 9   Fig. 10

RADIATION BEAM APPARATUS AND METHOD

RELATED APPLICATIONS

This is a continuation of application Ser. No. 165,445 filed July 26, 1971 (now abandoned), which is a continuation-in-part of Ser. No. 710,517 (abandoned) filed Mar. 5, 1968 for Radiation Beam Apparatus and Method which was a continuation-in-part of Ser. No. 501,395 filed Oct. 22, 1965 now U.S. Pat. No. 3,371,404 and having as a parent application Ser. No. 668,561 filed June 27, 1957, now abandoned. This is also a continuation-in-part of application Ser. No. 12,082 filed Feb. 17, 1970 for Work Processing Apparatus (abandoned).

SUMMARY OF THE INVENTION

This invention relates to an apparatus and method for operating on matter disposed in a reaction chamber by generating intense radiation in the form of an intense beam or beams of coherent light or electrons generated externally of said chamber and beamed therein through one or more windows or openings in the wall of the chamber. By employing such an externally generated source or sources of radiation and directing same through a window or windows in the chamber, the necessity of shielding the beam generator from heat and pressure is eliminated.

Various chemical reactions involving intense pressure and heat and conducted within an enclosed reaction chamber by rapidly increasing the temperature of chemicals within the chamber as the result of rapid combustion or burning. It is a primary object of this invention to provide a new and improved apparatus and method for creating chemical reactions in a chamber to form new materials or perform work that is the result of the intense radiation directed as a beam at one or more predetermined locations within the chamber and operative to rapidly raise the temperature of materials disposed therein.

Another object is to provide apparatus and method for rapidly raising the temperature of one or more substances located within a closed chamber for performing tests thereon without the necessity of applying heat by burning a fuel or disposing a heating means such as an electrode directly within the chamber.

Another object is to provide a new and improved method and apparatus for generating intense, high-temperature pressure pulses or shock waves within a reaction chamber.

Another object is to provide a new and improved method and apparatus for vaporizing materials in an enclosed chamber without the need for applying electrical energy to electrodes or providing electrodes within the chamber.

Another object is to provide new and improved internal combustion apparatus such as an internal combustion engine.

Another object is to provide new and improved fuel burning apparatus such as jet engines and rockets.

Another object is to provide new and improved radiant beam apparatus.

With the above and such other objects in view as may hereafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

In the drawings:

FIG. 1 is a side view with parts broken away and sectioned for clarity of a reaction chamber apparatus showing at least a portion of the reaction chamber thereof and means situated outside of the reaction chamber for generating high temperatures and pressures including shock waves within the reaction chamber;

FIG. 2 is a side view with parts broken away and sectioned for clarity of a modified form of the apparatus of the type shown in FIG. 1;

FIG. 3 is a side cross sectional view of a reaction chamber and means for movably supporting work therein to receive radiant energy from an external source;

FIG. 4 is a cross sectional view of a rocket engine having externally supported means for initiating and sustaining combustion within the chamber;

FIG. 5 is a side cross sectional view of another form of rocket motor employing externally mounted, radiant energy generating means for igniting the rocket fuel;

FIG. 6 is an end view of a plurality of reaction chambers and an externally mounted means for selectively directing radiant energy into said chambers;

FIG. 7 is a partial side view of a radiant energy beam transmitted through a fluid stream and applicable to the apparatus of FIGS. 1-6;

FIG. 8 is a partial side view of a radiant energy beam transmitted through a tubular fluid stream;

FIG. 9 is a view of a radiant energy beam and associated fluid stream cooperating yet operating on a work piece;

FIG. 10 is a side view of radiant energy and fluid stream means intersecting a work piece and applicable to the apparatus of this invention.

Figures 11, 12:
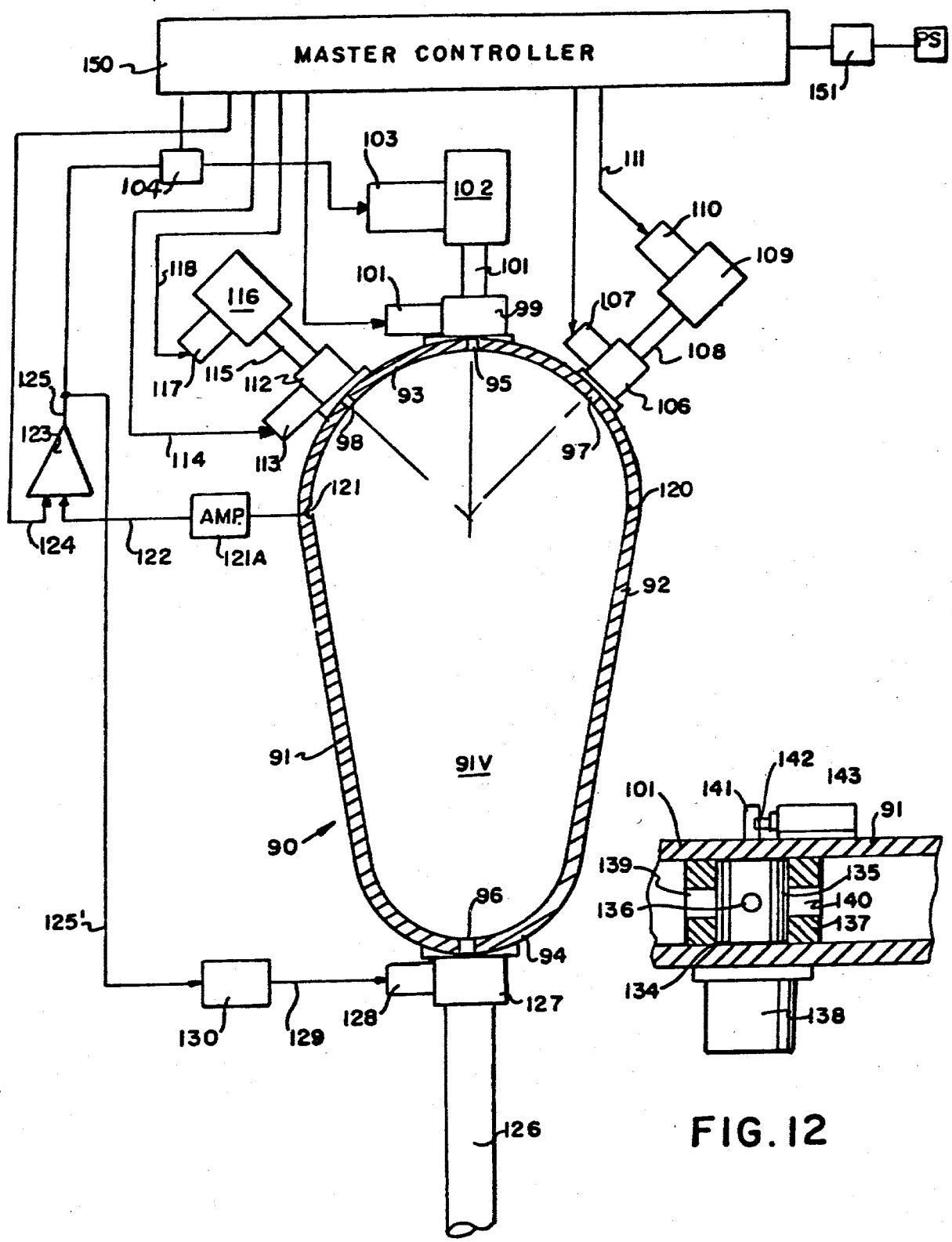
FIG. 11 is a side view with parts sectioned of a modified form of reaction apparatus and control means therefore and FIG. 12 shows a valving arrangement applicable to FIG. 11.

There is shown in FIG. 1 a reaction apparatus 10 operative for performing various operations on work-in-process and having an elongated reaction chamber 11 which may also be spherical, having a head end 12 at least a portion 12' of which is made of a light transmitting material such as high temperature glass, quartz or transparent ceramic having the ability to withstand high temperatures and pressures. The entire reaction chamber may also be made of or lined with a high temperature ceramic material such as Pyroceram manufactured by the Corning Glass Works of Corning, N.Y. Disposed externally of the reaction chamber 11 on a mount supported preferably by the means supporting the chamber are shown a plurality of radiant energy beam generating devices 17, 18 and 19 such as electron guns or lasers adapted to generate respective beams 17', 18' and 19' of intense coherent light energy which are directed through different portions of the window 12' and aimed to converge on a defined small volume 14' within the chamber or to intersect at a point 14' within the chamber. One or all the beams may also be directed through small openings in the wall of the chamber which may be 2-100 times the diameter of the beam and may replace the transparent window. In the illustrated embodiment, the energy generated by each beam in heating the portion of the window thru which it passes, is not sufficient to damage said window but the concentration of radiant energy from the plural beams at the working region or focal point 14' may be utilized to generate substanially higher temperatures in the working zone than would be generated by a single beam which may necessarily be of such an intensity to destroy or damage the window 12'.

Where used herein, the term window may be construed to mean a transparent insert in the chamber wall or a small opening extending through the chamber wall through which the laser light beam or other form of radiant energy may pass to the interior of the chamber.

The arrangement illustrated in FIG. 1 may be utilized to perform a number of different operations on matter disposed within the reaction chamber. In the arrangement illustrated in FIG. 1, the reaction chamber 11 is employed as a shock tube in which one or a plurality of shock waves are generated by means of intense radiant energy directed into the tube as described and travel down the tube to react on matter therein or matter disposed beyond the far end of the tube. Certain of the operations which may be performed by such a shock tube are described in application Ser. Nos. 668,561 and 501,395.

If the lasers 17, 18 and 19 are simultaneously activated to each generate an intense pulse of light energy in phase with each other, intense heating of the focal volume 14' will result within the reaction chamber 11 near the head end thereof and gas or liquid molecules disposed within said focal volume will be rapidly heated and expand rapidly outwardly therefrom to form a shock wave SW a portion of which wave immediately travels down the reaction chamber while the remaining portion of the shock wave will reflect off the side and head end walls of the chamber and also travel down the chamber reacting on fluid therein. Working and/or driving fluid or other fluent material may be injected through or near the head end 12 of the chamber either continuously or intermittently in phase with the operation of the lasers to produce predetermined results or reactions. Notations 15 and 15' refer to inlet ducts which are respectively connected to openings 13 and 13' in the head end wall 12 of the reaction chamber 11 and fluent material introduced thereto as well as along other portions (not shown) of the wall of the reaction chamber may be utilized to serve as the medium in which the shock waves are generated and/or to be reacted on by the shock waves so generated. Gas, vapors, particulate material or solids may be introduced through one or more inlets to the reaction chamber 11 at a predetermined rate of flow to effect predetermined chemical reactions for the analysis thereof or the production of new compounds as described in said copending applications.

The reaction device 10 illustrated in FIG. 1 may also be utilized to produce work or to generate a reaction force. For example, if a gaseous or vaporous fuel is injected through the inlet lines 15 and 15', it may be rapidly expanded and exploded within the reaction chamber to cause the device to be operative as an intermittent rocket or pulse jet. If a piston is disposed within the reaction chamber and free to slide back and forth therein, the rapid heating and explosion and expansion of gases injected into the volume 14 may be utilized to drive the piston to perform work either directly or indirectly. The chamber 11 may thus be one of a plurality of cylinders forming part of an internal combustion engine of conventional piston-cylinder arrangement which is operative to drive a shaft or other suitable mechanical means. The hot expanding gases generated by the direct rapid heating thereof by the laser beams or the explosion of combustible mixtures within the reaction chamber 14 may also be directed to operate a turbine or other high-temperature engine. The heat and pressures generated by the shock waves or explosions resulting from directing the intense radiant energy beams through the window 12' may also be utilized to perform physical as well as chemical changes in matter such as shock wave or explosion bonding of two or more sheets of metal together, cladding two sheets together or a particulate material disposed on the surface of the sheet placed on the path of the shock waves, or forming one or more sheets against a die aligned with the far end of the reaction chamber 11 as described in said parent applications. The apparatus of FIG. 1 may also be utilized to effect chemical reactions involving one or more gases or fluent materials disposed within the volume 14 surrounded by the chamber. It is noted that the fixture 16 on which the multiple lasers 17, 18 and 19 are mounted may contain means for adjusting or predeterminately varying the attitudes of one or more of the lasers and may include means for mounting or supporting the combustion chamber 11 in a predetermined attitude with respect to the lasers to permit the location of the focal volume 14 to be adjustably changed or varied during the cycle of operations. If the apparatus of FIG. 1 is used to effect the welding of a work piece disposed within a chamber 11, then the plurality of lasers may be individually controlled by respective servo motors receiving control signals from a master controller such as a computer to direct the respective beams of intense coherent light to simultaneously intersect the same or different areas of the work piece for performing the same or different welding or other suitable operations on the work disposed within the chamber.

In FIG. 2 is shown a modified form of reaction chamber apparatus 20 employing a totally encloseable reaction chamber 21 having a head end 22 containing an opening 23 therein in which is disposed a window 24 of the type hereinabove described through which window a light beam 27' may be directed from a source 27 such as a laser. A light beam 27' is shown intersecting a wire element 29 disposed within the volume 26 surrounded by the reaction chamber and is operative to vaporize said wire to provide metal vapor within the chamber volume 26. Accordingly, the apparatus 20 may perform one or more of a plurality of functions involving the use of a vaporized metal or other material. For example, the reaction chamber 21 may be part of a vacuum metallizing chamber containing objects (not shown) situated therein to become vacuum metallized when the metal vapor, such as aluminum, is formed by the action of the beam, and flows to the surface of the object. A feeding device 28 for the wire 29 is situated exterior of the chamber 21 and feeds the length of wire 29 through an opening 25 in the wall of 21 at a predetermined speed. The wire may be positively electrically charged to effect suitable flow of the vapor to the articles to be coated which may be negatively charged. The device 28 contains a coil supply of said wire and a servo motor for predeterminately feeding same to the beam 27' passed through window 24. Provided but not shown in FIG. 2 is a suitable means for evacuating air from the interior of chamber 21, when necessary to effect vacuum metallizing or other production functions employing material evaporated from the wire or rod 29 fed to the beam.

The device 20 of FIG. 2 may also be utilized as a source of vaporous metals or other materials used in plasma apparatus such as magneto hydrodynamic generators. Accordingly, suitable means may be provided for predeterminately conveying or otherwise removing the vaporous material from the chamber 21 to the volume where it is utilized.

In FIG. 3 is shown a modified form of high temperature apparatus 30 including a reaction chamber 31 defining a totally enclosed internal volume 31V in which is disposed a manipulation apparatus 40 for one or more units of work 45 to be operated on by an intense radiation beam directed into the volume 31V from an external source of energy mounted in a housing 36. An opening 32 in the side wall 31a of the housing 31 has a frame or mount 33 for a focusing lens 38 which is sealingly secured therein in alignment with the output of a source of intense light energy provided in a housing 36, the flange of which is secured and sealed to the side wall 31a. Light from the source within housing 36 is directed through the lens 38 and focused on a work piece 45 which is mounted on a rotatable base 41 supported on a mount 41' containing a program controllable motor (not shown) for predeterminately rotating said base to predeterminately locate one or more work pieces on the top of the table 41 with respect to the focal point of light 39 passed through the lens 38. The base 41' is secured to arm 42 which is the shaft of a lineal actuator 43 which is also automatically controllable to move the assembly employing the work in a direction parallel to the side wall 31a so that substantially any location on the upper surface of the work 45 may be moved in two directions with respect to the focusing light energy for scanning same such as in the act of welding or inspecting said surface. Further means (not shown) may be provided for either moving the base 41' in a direction towards and away from the housing 36 to vary the location of the focal point of the beam 39 in direction above the table 41.

Notation 35 refers to a vacuum pump secured to the end wall 31b of housing 31 which communicates through an opening 34 in said end wall with the interior volume 31V for removing atmospheric air therefrom. The apparatus 30 also includes one or more doors 46 for admission and removal of work and may include conveying means (not shown) operative to transport work to and from the interior volume 31V prior to and after it has been processed as described.

The operation of the light source in housing 36, variation in its intensity and location of its focal point within the chamber 31V, means for removing air or providing an atmosphere within the chamber and the operation of the servos for predeterminately positioning the work on table 41 may all be under the control of a single computer or cycle controller such as a multi-circuit timer to effect preprogrammed operations on a work piece disposed within the chamber.

The apparatus of FIG. 3 may also be modified to include a plurality of windows of the type illustrated and different sources such as lasers disposed in alignment with respective of said windows for generating and directing respective beams of light energy therethrough to cooperate in scanning the same or different areas of one or more work pieces disposed within the chamber 31.

FIG. 4 illustrates a liquid rocket motor 50 embodying features of the invention heretofore described. The rocket motor 50 is provided with a casing 51 having a side wall 51' which is opened at one end 53 and defines an internal volume 56 in which fuel is burned and rapidly accelerated rearwardly through the throat section 52 of the casing to generate thrust. The head end 54 of the motor casing has a plurality of inlets, two of which, 57 and 58, are shown which are defined by respective fuel nozzles mounted therein and fed by one or more liquid propellant or fuel materials which are ignited by an intense radiant energy or light beam 60 generated by a laser mounted in a housing 59 supported at the front end of the casing 51. An opening 61 in the front wall 54 of the rocket casing is either sealed by means of the housing 59 or contains a transparent window which is sealed therein through which a beam 60 of intense light energy is directed to the interior volume 56 and intersects fuel being fed through the inlets 57 and 58 to cause the ignition of same. Said fuel may be fed continuously or as a series of intermittent injections into the interior volume 56 while the laser beam 60 may be generated continuously or intermittently in timed relationship to the injection of fuel to provide an optimum burning condition for a constant flow or pulse rocket. If the inlets 57 and 58 respectively provide for the admission of ram air and a combustible fuel, the device 50 may be operative as a ram jet or pulse jet with the laser device in housing 59 operative to sustain combustion or effect the intermittent explosion of the combustible mixture to provide thrust.

FIG. 5 illustrates a modified form of rocket 62 which may be a liquid or solid propellant rocket having a casing 63 defined by a side wall 63', an end wall 64, and a throat section 65 near the open end of the rocket. Mounted in a housing 68 against the end wall 64 is a laser, the output light energy of which is directed along a fiber optical bundle situated in a casing 70 which extends axially through the combustion chamber 66 to a point near the exit end of the rocket. When ignition of the solid propellant is desired, the laser 68 is suddenly energized generating an intense pulse of light which is transmitted along the fibers of the bundle in casing or tubes 70 to the end 70' thereof from which the light exits and is operative to ignite propellant immediately in front of the end of the bundle after which combustion continues by conventional burning means. Notation 69 refers to coupling means between the near end of the fibers of the optical fiber bundle and the output end 70' of the laser in housing 68. It is noted that an optical fiber bundle may also be extended from a laser into the open exit end of the rocket or through the side wall thereof to ignite rocket fuel when it is desired to generate thrust. Ignition may also occur as the result of a laser disposed beyond the exhaust end of the rocket and preferably off axis therefrom so as to position the laser away from the direct exhaust gases.

FIG. 6 illustrates an apparatus 72 which comprises a plurality of reaction chambers, combustion chambers or rocket engines defined by notations 73, 74, 75, 76 and 77 shown arranged as a cluster of four surrounding the internal chamber 77. Such chambers may also comprise piston-containing combustion chambers of an internal combustion engine such as a gasoline or other fuel burning engine operative to rotate a crank shaft when fuel is burned in the respective chambers in a synchronous manner to drive respective pistons coupled by piston rods to said crank shaft.

The novel essence of the invention defined in FIG. 6 comprises the application of the intense radiation generated by one or more lasers to ignite fuel in the respective cylinders or chambers either simultaneously or in the required sequence. In FIG. 6, a single laser is preferably supported by a gimball mount and is operated by means of a servo 79 coupled to said gimball mount and output shaft means 80 to to predeterminately vary the direction of the intense light beam of the laser so as to predeterminately direct it at each of the cylinders or combustion chambers in sequence. The end walls of each of said chambers are provided with respective openings and light transmitting windows defined by notations 73', 74', 75', 76', etc. through which intense light energy may be directed from the single laser 78 when properly aimed thereat as the laser is pivotally moved on its mount. Thus, explosions or reactions may be intermittently generated by pulsing and pumping light from the laser 78 through the openings or windows in each of the cylinders in sequence. The cylinders may be arranged as in a conventional internal combustion multi-cylinder engine or in any other suitable arrangement such as that illustrated to generate shaft work or thrust or to create chemical reactions or other work in each of the cylinders. Bundles of optical fibers may also extend from a single laser 78 through the walls or to the window portions of each of the cylinders 73 to 77 to simultaneously transmit light energy to each for the purposes described. A mechanical or electrical light distribution device coupled between the output of the laser and the respective fiber optic bundles may be utilized for channeling each pulse or group of pulses generated at the output of the laser to respective of the cylinders in a desired sequence.

In lieu of pivotally moving the housing for the laser as described to control the direction of the laser beam, it is noted that an electrical deflection means or optical means mounted within the housing may be utilized to deflection control the beam to scan respective of the cylinder windows or optical fiber bundles extending thereto.

FIGS. 7-10 illustrate a number of transmitting and flow arrangements for fluids and intense radiant energy beams which are applicable to the apparatus hereinabove described or other similar apparatus. In FIG. 7 is shown an intense radiant energy beam 81 such as that generated at the output of alaser directed along a fluid stream 82 which may comprise a swiftly flowing gas or liquid which is operative to either shield the beam from the surrounding atmosphere, protect or cool work and material adjacent the area being intereseted by the beam and prevent the rapid heating of the ambient atmosphere or to cooperate with the beam in performing one or more operations on a work piece. The stream 82 may comprise a high-velocity stream of a reactant gas or inert gas which may also be operative to chemically or physically react on the material of the substrate intersected by the beam 81. Oxygen, for example, will serve to rapidly oxidize the material intersected thereby in the beam for cutting or erosion purposes. If the beam 81 is to be utilized to weld, the gas stream 82 may be an inert gas operative to protect the heated and welded portion of the work intersected thereby. The swiftly flowing gas stream 82 may also be operative to cause the flow of material which has been melted by beam 81 away from the area intersected thereby so as to machine or erode portions of the work.

In FIG. 8, a hollow fluid stream 83 is generated about a gaseous or vaporous interior volume 84 through which volume an intense light energy beam 81 is directed. If intersected against a work piece which is adapted to be eroded or welded by means of the beam 81, the jacket of inert gas 83 may be operative to protect the area heated by the beam 81 from heat corrosion. FIG. 9 illustrates a machining or erosion arrangement in which a beam 81 of intense light energy such as the described laser beam, is directed against the surface of a substrate or work piece W and the area said beam intersects is also reacted on by a high-velocity jet stream 85 of suitable fluid which may be operative to cause the flow of material melted by the beam away from the area's intersection or to cooperate with the beam in cutting, eroding, welding or otherwise reacting on the work W.

Another arrangement is illustrated in FIG. 10 wherein a plurality of intense radiant energy beams, two of which 87 and 88 are shown, are generated and focused against a small area of the surface of the work member W while a high-velocity stream of fluid or other particles 86 is directed against substantially the area of the work intersected by the beams. Here again, the apparatus shown in FIG. 11 may be utilized for welding, cutting erosion, test or chemical reaction purposes and the beams, as well as the stream of fluid 86 may be beppredeterminately controlled to effect a predetermined operation on the work.

The beam and fluid arrangements shown in FIGS. 7-10 may be applied to any of the heretofore described apparatus for the purposes of reacting on solids, liquids or gases disposed in a closed or partially closed chamber for chemical processing, inspection, testing and analysis of materials, surface erosion, cutting, welding, heat treating or otherwise processing matter. Applications of the beam-fluid arrangements shown in FIGS. 7 to 10 may include, in addition to those shown in FIGS. 1 to 6 wherein the fluid stream or streams may be generated exterior and/or interior of the reaction chamber, other arrangements as follows:

I. The fluid streams 82, 83, 85, 87 and 88 of FIGS. 7 to 10 may contain one or more chemicals in gaseous, vaporous or solid (particulate) form adapted to be deposited on the surface of the workpiece which is intersected by the beam and heated or melted in a manner such that the material carried by the fluid stream either combines with or is molecularly bonded or welded to the substrate upon solidification of said material after the beam has been removed or shut off.

II. Fluid, such as a gas, may be so heated by the beam of intense radiant energy 81 directed therethrough as to be capable of heating and burning, melting, vaporizing or softening or otherwise affecting the work intersected by the fluid stream. The beams 81 or 87,88 may be continuously or intermittently generated simultaneously with the generation of the fluid stream or in between pulses of fluid stream generation. In this connection, the beam may be used to spot weld or heat treat a portion of the substrate or work and the fluid stream may be used to cool the melted material or to prevent its heat corrosion immediately thereafter.

III. The described fluid streams may contain abrasive particles adapted to erode the surface intersected thereby with the beam operated to heat the surface being abraded to facilitate the abrading action. If the particles are to be deposited to form a coating on the workpiece, then they as well as the workpiece may be heated by the beam to facilitate and improve the coating action.

IV. Two or more streams of fluids such as gases or liquids of combinations of these and either one or both of which contain an intense radiation beam directed therealong, may be directed to intersect each other to create chemical or molecular reactions resulting at least in part from the temperature of the radiation beam.

V. Particulate coating or deposition material may be controllably introduced into the fluid stream(s) and melted or vaporized in transit therealong to permit it to be coated or plated onto the work or substrate intersected by the stream and/or beam. The substrate receiving same may be heated by the beam and hot fluid heated by the beam to render same molten or at high temperature such as to facilitate or make possible the coating by the solid particulate or molten material carried by the beam.

VI. Work erosion or machining actions resulting from the arrangements shown in FIGS. 7 to 10 may include in addition to cutting, boring, drilling, controlled material removal, deburring, and the softening of metal to render it easier to be machined by a cutting tool, the movement of material from one location to another on the workpiece by the mechanical force of the fluid stream reacting against the softened or molten material rendered in such condition by the beam and the heated fluid.

VII. The arrangement shown in FIG. 8 may define a tubular member (83) of metal or ceramic along the passageway 84 of which an intense laser beam is directed to intersect the work. Vapor of the material of the workpiece formed by the intense heat of the beam pulsed in the tubular member may be drawn through the tube by applying suction thereto and may be analyzed when so drawn off by suitable automatic analysis means. The pulsing of the beam and the application of vacuum pressure to the tube may be automatically controlled to effect a predetermined sampling and analysis.

Modifications to the apparatus described may include the elimination of light transmitting windows in the wall of the reaction chambers and their replacement with small openings in the wall of the chamber which may remain open during the operation of the apparatus or may be closed immediately after passage therethrough of the intense beam or beams of radiant energy. For example, a small opening in the wall of the reaction chambers of FIGS. 1-3 perhaps two to five times the diameter of the radiation beam may replace the illustrated translucent windows for allowing the passage of intense laser generated light to pass from the exterior of the chamber to the interior thereof. Larger diameter openings may be provided if a valve is disposed and operates to close the opening or passageway leading thereto immediately after the pulsed beam has passed therethrough. If the opening is employed per se the atmosphere within the chamber may be controlled by pressurizing same with suitable inert or reaction gas. Vacuum may be retained within the reaction chamber by controlling the atmosphere within the duct leading to the chamber and terminating at the wall portion containing the small opening. In certain specialized equipment and mode of operation, the reaction chamber may be closed and the intense laser or electron beam may enter said chamber by boring a small hole in the wall of the chamber to effect the desired chemical reaction. The hole may remain to accomodate and pass subsequently generated pulses of intense radiation or may be automatically sealed off by means of a suitable sealant associated with or encapsulated within the chamber wall. A subsequently generated beam may also be utilized to seal off the opening bored by the previous beam. It is also noted that gas directed along the beam as taught in FIGS. 7 and 8 may also be employed to prevent air or other contaminating material from entering the small opening in the chamber wall during the operation of the beam. Particles directed along the gas stream and/or beam per se may also be employed to fill and close off the hole bored by the beam in the chamber wall.

FIG. 11 illustrates further details and improvements in the instant invention wherein means are provided for controlling the admission of material to a reaction chamber such as a chemical reactor or rocket engine and the generation of intense radiation for predeterminately reacting on the material admitted to perform one or more of the described functions of heating, causing chemical changes therein, generating thrust or generating gas at high pressure: Control means are provided in FIG. 11 which may be applied to the hereinabove described embodiments with obvious modifications without departing from the nature of the invention.

In FIG. 11, a reaction apparatus 90 includes a reaction chamber 91 having a suitable side wall 92 and end wall portions 93 and 94 preferably of spherical or bulbous configuration and make of a suitable high temperature, high strength metal, metal laminate or filament wound composite such as boron, boron nitride, boron carbide or other high strength filament reinforced metal, metal alloy, ceramic or carbon material capable of withstanding high temperature and pressure. A small window or opening 95 is provided in the end wall 93 thru which an intense radiation beam by be directed from a beam generator such as a laser or electron gun 102' located in a housing 102. The beam is directed along a tube 101 thru a valve 99 which is aligned with opening 95 and secured to the end wall 93. The valve 99 is operated by a solenoid or motor 100 to open and close intermittently under the control of a master controller 150 which generates control signals in sequence to control the variables of material admission beam generation and, if necessary, material exhaust or flow from the chamber when a start-switch 151 is closed.

Secured in alignment with a plurality of openings 97 and 98 in the chamber wall adjacent the window or opening window 95 are respective valves 106 and 112 which are operated by respective solenoids or motors 107 and 113 which are also controlled in operation by signals generated by master controller 150. Inlet ducts 108 and 115 extend from respective reservoirs 109 and 115 of liquid, gaseous, particulate or vaporous material to be flowed through ducts 108 and 115 and valves 106, 112 to the interior 91V of chamber 91 preferably along predetermined paths or streams of particle or fluid flow such that it may be detected within the chamber and/or predeterminately intersected by the beam of intense radiation. Notations 110 and 117 refer to respective motors or other form of electrically controlled servo devices which may be automatically controlled by signals generated on input lines 111 and 118 extending thereto from the master controller or computer 150.

While the apparatus 90 may be operated as a rocket engine or may merely exhaust the products of reaction through an open end thereof, shown in FIG. 11 is an exhaust opening 96 to the chamber 91 and a valve 127 secured to the end wall 94 in alignment with opening 96 for controlling the flow of products of reaction from the chamber. The valve 127 is controlled by a solenoid or motor 128 to open and close in accordance with control signals transmitted thereto on a circuit 129 as will be described.

The intense radiation beam generator in housing 102 is operated to intermittently generate pulses of radiation by a control 103 which may operate in accordance with the teachings of my copending application Ser. Nos. 856,876 and 12,082 wherein a radiation beam of the desired intensity is generated thereby and directed along tube 101 thru open valve 99 and into chamber volume 91V in response to a trigger signal generated on the input 104 to the beam generator trigger control 103. The trigger pulse may be generated either as a direct output signal of the master controller or computer 150 or by means of logical circuitry to be described depending on the mode of operation desired and the particular reaction parameters. In FIG. 11, a double throw switch 104 may be manually operated to connect the input 104 to the beam generator trigger control 103 either directly to an output of master controller 150 or logical switching means 123 to be described.

If the beam operated reaction occurring within chamber 91 is of such a nature that timing control means may be employed to control the admission of material to the reaction zone of the chamber and the operation of the beam generator, and removal of reaction material, then master controller 150 may comprise a multi-circuit self-recycling timer or open loop computer. However, if it is desired to fire the laser or electron gun to cause the beam to predeterminately react on a quantity of matter injected into the chamber and variations may occur in the operation of the system, then the material injected thru either or both the inlets 97 and 98 may be sensed and detected by a device such as a photoelectric or infra-red detector 121 disposed in the wall of the chamber which may be operative to generate a detection signal on its output 122 which is amplified in amplifier 121A and applied to one input of a logical AND switching circuit 123 the other input to which has been energized by a signal generated by master controller 150 when both the inputs of circuit 123 are simultaneously energized, a signal is generated on its output 125 which is transmitted to activatethe beam generating trigger circuit 103 of the laser 102. The valve 99 through which the laser beam is passed into volume 91V may either have been opened by a signal generated by master controller 150 and applied to the valve servo or solenoid 100, or the valve solenoid 100 may be pulsed to open by a reproduction of the signal generated on the output 125 of AND circuit 123. The characteristics of the valve 99 are such that it will remain open when opened for a sufficient time interval to allow the pulse of radiant energy generated by laser 102 to pass therethru before it closes immediately after the passage of the beam therethrough.

The output signal of AND circuit 123 is also passed to a delay relay or delay line 130 which is preferably adjustable to cause it to generate a control signal for pulsing a solenoid 128 for operating an exhaust valve 127 between chamber volume 91V and exhaust line 126 for allowing the products of reaction to controllably escape or be exhausted from the chamber. The valve 127 may also be eliminated for those applications where it is desired to cyclically exhaust material from the chamber immediately after and as a result of the direct pressure increase caused by the intense radiation of the beam and/or the resulting explosive reaction. Valve 127 is used where it is desired to increase pressure and retain reaction material in the chamber for a predetermined time interval after one or more pulses of radiation and one or more quantities of reaction material have been injected into the chamber.

In FIG. 12 is shown a further means for controlling the operation of the radiation beam generating means in accordance with the operation of a high speed valve wherein valve operation controls the pulsing of the laser or electron gun. The valve 134 of FIG. 12 is a rotating cylinder 135 disposed in a seat 137 located between duct 101 and chamber 91 and rotated by means of a speed controlled motor 138 to align a small hole 136 extending diametrically thru the cylinder 135 with respective inlet and outlet holes 139, 140 in the valve seat. When such alignment is effected during each half revolution of the valve cylinder 137 the laser or electron gun is pulsed by a signal generated by a limit switch 141 which is actuated by a cam 142 on the shaft 141 supporting cylinder 135. The limit switch 148, shown mounted exterior of duct 101 may also be a photoelectric cell and control or proximity switch scanning suitable indicia or magnetic markers on the cylinder or motor shafts to generate pulses during each half revolution of shaft 141 which pulses are passed to the trigger control 103 of the laser or electron gun in housing 102 and may also be applied to open valves 106 and 112 by pulsing their solenoids or pulsing pump actuating means for admitting charges of one or more reaction materials from reserviors 109 and 116.

It is noted that the hereinbefore described apparatus may also be operative to create chemical reactions by employing other forms of radiant energy such as molecular beams and focused infra-red or other wave lengths of energy which is pulsed through one or more windows in the reaction chamber walls.

In the apparatus of FIG. 11 is noted that the master controller 150 may be of the self-repeating type such that it will continue to recycle and control beam operation and the operation of the devices controlling flow of fluid or particles to the chamber as long as switch 151 is closed and gates energy from a source of electrical power denoted PS to the controller. The master controller 150 may also be operative to cycle in response to a signal generated, for example, by a transducer, timer or other device associated with the apparatus illustrated.

I claim:
1. A method for reacting on matter comprising:
   (a) controllably directing a predetermined quantity of matter to be operated on into a reaction chamber having a wall containing a window through which window radiant energy may pass;
   (b) supporting an intense radiant energy beam generating means exterior of said chamber and, when said predetermined quantity of matter has been predeterminately disposed in said chamber, energizing said beam generating means so as to cause it to generate a pulse of intense radiant beam energy;
   (c) directing said pulse of intense radiant beam energy from said generating means through said window to the interior of the chamber;
   (d) causing said pulse of intense radiant beam energy to intersect said matter within said chamber;
   (e) transferring sufficient radiant energy from said pulse of intense radiant beam energy to said matter so as to intensely heat said matter disposed in said chamber and to cause a predetermined change in said matter; and (f) thereafter controllably removing material reacted on by said beam from said chamber by passing said material through a valve, and further including actuating said valve at a predetermined time after operating said radiant energy generating means to cause it to open for exhausting material from said chamber.

2. A method for reacting on matter comprising:
(a) controllably directing a predetermined quantity of matter to be operated on into a reaction chamber having a wall containing an opening through which opening radiant energy may pass;
(b) supporting an intense radiant energy beam generating means exterior of said chamber and, when said predetermined quantity of matter has been predeterminately disposed in said chamber, energizing said beam generating means so as to cause it to generate a pulse of intense radiant beam energy;
(c) directing said pulse of intense radiant beam energy from said generating means through said opening to the interior of the chamber;
(d) causing said pulse of intense radiant beam energy to intersect said matter within said chamber;
(e) transferring sufficient radiant energy from said pulse of intense radiant beam energy to said matter so as to intensely heat said matter disposed in said chamber and to cause a predetermined change in said matter; and
(f) thereafter controllably removing material reacted on by said beam from said chamber by passing said material through a valve, and further including actuating said valve at a predetermined time after operating said radiant energy generating means to cause it to open for exhausting material from said chamber.

3. A method for cyclically reacting on matter comprising performing the following steps in sequence:
(a) controllably directing a predetermined quantity of matter to be operated on into each of a plurality of reaction chambers, each chamber having a wall containing an opening through which opening radiant energy pulses may pass;
(b) controllably generating intense radiant energy beam pulses from a single source, each of a predetermined duration and of sufficient energy to heat said matter, and directing said radiant energy pulses in sequence through successive of said openings in said chamber to intersect said predetermined quantity of matter within said chamber;
(c) in each chamber transferring sufficient radiant energy from said radiant energy pulses to said matter so as to intensely heat said matter disposed in each of said chambers and to cause a predetermined change in said matter;
(d) controllably removing material reacted on by said radiant energy pulses from said chambers; and
(e) repeating said steps (a) to (d) in sequence.

4. A method in accordance with claim 3 wherein said step of controllably generating intense radiant energy beam pulses comprises controllably generating laser pulses.

5. A method in accordance with claim 3 wherein step (c) comprises transferring sufficient radiant energy from said radiant energy pulses to said matter so as to intensely heat said matter in each of said chambers and to cause an irreversible chemical change in said matter.

6. A method in accordance with claim 3 wherein step (c) comprises transferring sufficient radiant energy from said radiant energy pulses to said matter so as to cause said matter to be vaporized.

7. A method in accordance with claim 3 wherein step (d) comprises controllably removing changed material reacted on by said radiant energy pulses from each of said chambers at a predetermined time interval after exposing said material to said radiant energy.

8. Reaction apparatus comprising in combination:
(a) means defining a reaction chamber, said chamber having a wall portion containing at least one opening;
(b) radiant energy beam generating means;
(c) means supporting said radiant energy beam generating means for directing a radiant energy beam along a path through said opening into said chamber;
(d) at least one inlet in said chamber;
(e) means for feeding reaction material through said inlet into said chamber;
(f) at least one outlet in said chamber;
(g) valve means for controlling the exhaust of reaction products from said chamber; and
(h) means controlling in predetermined sequence said feeding means to feed a predetermined amount of reaction material into said chamber, said radiant energy beam generating means to direct at least one radiant energy beam pulse of predetermined duration into said chamber, and said valve means to exhaust the reaction products from said chamber.

9. A method for cyclically reacting on matter comprising performing the following steps in sequence:
(a) controllably directing a predetermined quantity of matter to be operated on into a closed reaction chamber having a wall containing a window through which window radiant energy pulses may pass,
(b) controllably generating a plurality of laser beam pulses of predetermined duration and directing said laser beam pulses through spaced-apart portions of said window into said chamber to intersect said predetermined quantity of matter at a focal point within said chamber,
(c) transferring sufficient radiant energy from said laser beam pulses to said matter so as to intensely heat said matter disposed in said chamber and to cause a predetermined change in said matter,
(d) controllably removing material reacted on by said laser beam pulses from said chamber, and
(e) repeating said steps (a) to (d) in sequence.

10. A method for cyclically reacting on matter comprising performing the following steps in sequence,
(a) controllably directing a predetermined quantity of matter to be operated on into a closed reaction chamber having a wall containing an opening through which opening radiant energy pulses may pass,
(b) controllably generating at least one intense radiant energy beam pulse of predetermined duration and directing said radiant energy pulse through said opening into said chamber to intersect said predetermined quantity of matter within said chamber,
(c) transferring sufficient radiant energy from said radiant energy pulse to said matter so as to intensely heat said matter disposed in said chamber and to cause a predetermined change in said matter;

(d) controllably removing material reacted on by said radiant energy pulse from said chamber by passing said material through a valve and actuating said valve at a predetermined time after operating said radiant energy generating means to cause said valve to open for exhausting said material from said chamber;

(e) repeating said steps (a) to (d) in sequence.

11. Reaction apparatus comprising in combination:

(a) a reaction chamber having a wall portion containing a plurality of openings, (b) means defining a plurality of walled passageways each extending to a respective of said openings, (c) a plurality of intense radiant energy bean generating means, (d) means supporting said radiant energy beam generating means for directing their radiant energy beams along respective converging paths through respective of said passageways and openings into said chamber, (e) at least one inlet in a wall of said chamber, (f) means for feeding reaction material through said inlet into said chamber, and (g) means for controlling the operation of said radiant energy beam generating means and said reaction material feeding means to cause said radiant energy beams to intersect and to predeterminately react on said reaction material.

12. Reaction apparatus in accordance with claim 11 wherein said support means is adjustable to adjust the attitude of said radiant energy beam generating devices and consequently said radiant energy beams and said focal point.

13. Reaction apparatus comprising in combination:

(a) a reaction chamber having a wall portion containing a window, (b) means defining a walled passageway extending from said window, (c) a plurality of intense radiant energy beam generating means, (d) means supporting said radiant energy beam generating means for directing the radiant energy beams thereof along respective paths through said passageways and different portions of said window into said chamber, (e) at least one inlet in a wall of said chamber;

(f) means for feeding reaction material through said inlet into said chamber, and (g) means for controlling the operation of said radiant energy beam generating means and said reaction material feeding means to cause said radiant energy beams to intersect, heat and predeterminately react on said reaction material.

14. Reaction apparatus comprising in combination:

(a) a reaction chamber having a wall portion containing an opening and an exhaust outlet, (b) means defining a walled passageway extending to said opening, (c) intense radiant energy beam generating means;

(d) means supporting said radiant energy beam generating means for directing radiant energy beam along a path through said passageway and opening into said chamber, (e) at least one inlet in a wall of said chamber, (f) means for feeding a fuel through said inlet into said chamber, and (g) means for controlling the operation of said radiant energy beam generating means and said reaction material feeding means to cause said radiant energy beam to ignite said reaction material and to generate propulsive thrust by means of the products of reaction exhausting through said outlet.

15. Reaction apparatus in accordance with claim 14 further comprising a fiber optical bundle extending axially through at least a portion of said chamber from said opening in said wall portion of said chamber and terminating at a point near said exhaust outlet whereby said radiant energy beam is directed along said fiber bundle from said opening to the terminal end thereof to ignite said fuel at said exhaust outlet.

16. Reaction apparatus comprising in combination:

(a) a plurality of reaction chambers having respective wall portions containing openings, (b) means defining walled passageways extending from said openings, (c) intense radiant energy beam generating means, (d) means supporting said radiant energy beam generating means for directing radiant energy beams along paths through said passageways and openings into said chamber, (e) at least one inlet in the wall of each of said chambers, (f) means for feeding reaction material through said inlets into each of said chambers, and (g) means for controlling the operation of said radiant energy beam generating means to generate radiation and means for directing radiation generated by said radiant energy beam generating means along said passageways into each of said chambers so as to cause said radiant energy beams to intersect and to predeterminately react on reaction material in each of said chambers.

17. Reaction apparatus in accordance with claim 16 wherein said supporting means and said control means are adapted to direct said radiant energy beam into each of said chambers in a predetermined sequence.

18. Reaction apparatus in accordance with claim 16 further comprising a plurality of optical fiber bundles, each extending from said single radiant energy beam generating device to one of said reaction chambers, to direct a radiant energy beam to each of said reaction chambers.

19. Reaction apparatus comprising in combination:

(a) a reaction chamber having a wall portion containing an opening, (b) means defining a walled passageway extending from said opening, (c) intense radiant energy beam generating means, (d) means supporting said radiant energy beam generating means for directing radiant energy beam along a path through said passageway and opening into said chamber, (e) at least one inlet in a wall of said chamber, (f) means for feeding reaction material along said path of said radiant energy beam through said inlet into said chamber, and (g) means for controlling the operation of said radiant energy beam generating means and said reaction material feeding means to cause said radiant energy beam to intersect and to predeterminately react on said reaction material.

20. Reaction apparatus in accordance with claim 19 wherein said fluid material feeding means is adapted to feed said fluid material in an annular configuration about said radiant energy beam.

21. Reaction apparatus comprising in combination:

(a) a reaction chamber having a wall portion containing an opening,
(b) means defining a walled passageway extending from said opening,
(c) intense radiant energy beam generating means;
(d) means supporting said radiant energy beam generating means for directing radiant energy beam along a path through said passageway and opening into said chamber;
(e) at least one inlet in a wall of said chamber;
(f) means for feeding reaction material through said inlet into said chamber and along a further path within said chamber which further path intersects the path of said beam within said chamber, and
(g) means for controlling the operation of said radiant energy beam generating means and said reaction material feeding means to cause said radiant energy beam to intersect and to predeterminately react on said reaction material within said chamber.

22. Reaction apparatus in accordance with claim 11 further comprising means for feeding a fluid material along a further path into said chamber intersecting said converging paths of said radiant energy beams at said focal point.

23. Reaction apparatus comprising in combination:
(a) a reaction chamber having a wall portion containing an opening,
(b) means defining a walled passageway extending from said opening,
(c) intense radiant energy beam generating means,
(d) means supporting said radiant energy beam generating means for directing a radiant energy beam along a path through said passageway and openings into said chamber,
(e) at least one inlet in a wall of said chamber,
(f) vacuum means for feeding reaction material along said passageway through said inlet into said chamber; and
(g) means for controlling the operation of said radiant energy beam generating means and said reaction material feeding means to cause said radiant energy beams to intersect and to predeterminately react on said reaction material.

24. Reaction apparatus comprising in combination:
(a) a reaction chamber having a wall portion containing an opening,
(b) means defining a walled passage extending from said opening and valve means disposed between said passageway and said opening, said valve means comprising a rotatably mounted cylinder having at least one bore passing therethrough transverse to the axis of said cylinder,
(c) intense radiant energy beam generating means;
(d) means supporting said radiant energy beam generating means for directing radiant energy beam along a path through said passageway and opening into said chamber,
(e) at least one inlet in a wall of said chamber;
(f) means for feeding reaction material through said inlet into said chamber,
(g) means for controlling the operation of said radiant energy beam generating means and said reaction material feeding means to cause said radiant energy beam to intersect and to predeterminately react on said reaction material,
(h) means for rotatably driving said cylinder and timing means operated by said cylinder to cause said radiant energy beam generating means to generate a pulsed radiant energy beam when said bore is aligned with said passageway.

25. Reaction apparatus comprising in combination:
(a) means defining at least one reaction chamber, said chamber having a wall portion containing at least one opening;
(b) means defining a walled passageway extending from said opening;
(c) intense radiant energy beam generating means of sufficient energy to heat material;
(d) means supporting said radiant energy beam generating means for directing at least one radiant energy beam along a path through said passageway and opening into said chamber;
(e) at least one inlet in a wall to said chamber;
(f) means for feeding reaction material through said inlet into said chamber;
(g) an exhaust opening in the wall of said chamber and valve means for opening and closing said exhaust opening;
(h) means for controlling the operation of said radiant energy beam generating means, said reaction material feed means and said means for opening and closing said valve means in a predetermined sequence to cause radiant energy to be generated and to intersect reaction material in said reaction chamber and to control the exhaust of products of reaction from said reaction chamber.

* * * * *